(12) United States Patent
Kitahara et al.

(10) Patent No.: US 11,676,882 B2
(45) Date of Patent: Jun. 13, 2023

(54) METHOD OF MANUFACTURING POWER MODULE SUBSTRATE BOARD AND CERAMIC-COPPER BONDED BODY

(71) Applicant: MITSUBISHI MATERIALS CORPORATION, Tokyo (JP)

(72) Inventors: Takeshi Kitahara, Saitama (JP);
Tomoya Oohiraki, Saitama (JP);
Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/963,523

(22) PCT Filed: Jan. 23, 2019

(86) PCT No.: PCT/JP2019/002074
§ 371 (c)(1),
(2) Date: Jul. 21, 2020

(87) PCT Pub. No.: WO2019/146638
PCT Pub. Date: Aug. 1, 2019

(65) Prior Publication Data
US 2021/0050278 A1 Feb. 18, 2021

(30) Foreign Application Priority Data
Jan. 24, 2018 (JP) .............................. JP2018-009275

(51) Int. Cl.
*H05K 1/02* (2006.01)
*H05K 1/03* (2006.01)
(Continued)

(52) U.S. Cl.
CPC ...... *H01L 23/3735* (2013.01); *H01L 21/4871* (2013.01); *H05K 1/0306* (2013.01);
(Continued)

(58) Field of Classification Search
CPC ...... H05K 1/02; H05K 1/0218; H05K 1/0271; H05K 1/03; H05K 1/0306; H05K 1/09;
(Continued)

(56) References Cited

U.S. PATENT DOCUMENTS

| 4,954,386 A | * | 9/1990 | Mizunoya | ............. C04B 37/021 428/137 |
| 5,403,651 A | * | 4/1995 | Miyagi | ................ H05K 1/0271 428/209 |

(Continued)

FOREIGN PATENT DOCUMENTS

| DE | 102012104903 A1 | 11/2013 |
| EP | 1061783 A2 | 12/2000 |

(Continued)

OTHER PUBLICATIONS

Supplementary European Search Report dated Sep. 27, 2021, issued for European Patent Application No. 19744045.6.
(Continued)

*Primary Examiner* — Xiaoliang Chen
(74) *Attorney, Agent, or Firm* — Locke Lord LLP; James E. Armstrong, IV; Nicholas J. Di Ceglie, Jr.

(57) ABSTRACT

To provide a method of manufacturing power module substrate board at high productivity and a ceramic-copper bonded body in which warps are reduced. In a bonded body-forming step, a circuit layer-forming copper layer consisting of a plurality of first copper layers is formed by arranging and bonding a plurality of first copper boards on a first surface of a ceramic board, and a metal layer-forming copper layer consisting of a second copper layer with a smaller arrangement number than that of the first copper layers is formed by bonding a second copper board having a larger planar area than that of the first copper board and a smaller thickness than that of the first copper board so as to cover at least two of adjacent substrate board-forming areas (Continued)

on a second surface of the ceramic board among the substrate board-forming areas partitioned by the dividing groove.

3 Claims, 9 Drawing Sheets

(51) Int. Cl.
H05K 1/09 (2006.01)
H05K 1/18 (2006.01)
H05K 3/04 (2006.01)
H05K 3/06 (2006.01)
H05K 3/22 (2006.01)
H05K 3/38 (2006.01)
H01L 23/15 (2006.01)
H01L 23/373 (2006.01)
H01L 23/552 (2006.01)
C04B 37/02 (2006.01)
B32B 15/04 (2006.01)
B32B 15/20 (2006.01)
H01L 21/48 (2006.01)

(52) U.S. Cl.
CPC .................. *H05K 1/09* (2013.01); *H05K 3/04* (2013.01); *H05K 3/06* (2013.01)

(58) Field of Classification Search
CPC .......... H05K 1/18; H05K 1/167; H05K 3/022; H05K 3/04; H05K 3/06; H05K 3/38; H01L 21/481; H01L 21/4871; H01L 23/15; H01L 23/373; H01L 23/552; H01L 23/4629; C04B 37/02; B32B 15/04; B32B 15/20
USPC .... 29/842; 428/43, 137, 192, 209, 210, 433, 428/457, 469; 361/748, 792; 228/46, 228/198
See application file for complete search history.

(56) References Cited

U.S. PATENT DOCUMENTS

| 5,924,191 | A | 7/1999 | Credle, Jr. et al. | |
|---|---|---|---|---|
| 6,297,469 | B1* | 10/2001 | Schulz-Harder | H05K 3/0029 219/121.7 |
| 6,638,592 | B1* | 10/2003 | Schulz-Harder | B23K 26/0006 428/43 |
| 2002/0112882 | A1 | 8/2002 | Hirakawa | |
| 2003/0232204 | A1* | 12/2003 | Tsukaguchi | H05K 1/167 428/469 |
| 2007/0257351 | A1* | 11/2007 | Lee | H01L 23/3735 257/E23.092 |
| 2007/0297145 | A1* | 12/2007 | Karrer | H01L 23/3735 361/720 |
| 2010/0035024 | A1* | 2/2010 | Datta | H05K 1/0272 428/471 |
| 2010/0288536 | A1* | 11/2010 | Chiang | H01L 33/64 156/60 |
| 2011/0024086 | A1* | 2/2011 | Tan | H01L 23/3735 29/890.032 |
| 2012/0299375 | A1* | 11/2012 | Saez-Zamora | H05K 7/209 307/9.1 |
| 2013/0250562 | A1* | 9/2013 | Tanaka | H05K 1/18 361/720 |
| 2013/0250576 | A1* | 9/2013 | Betsuda | H05K 1/0209 362/382 |
| 2014/0291699 | A1* | 10/2014 | Yano | H01L 29/1608 257/77 |
| 2015/0366048 | A1* | 12/2015 | Nagase | B23K 20/02 174/255 |
| 2016/0052830 | A1* | 2/2016 | Oi | H05K 3/0061 228/103 |
| 2016/0126192 | A1 | 5/2016 | Hohlfeld et al. | |
| 2016/0133533 | A1* | 5/2016 | Lin | H01L 23/142 257/766 |
| 2016/0135293 | A1* | 5/2016 | Lin | H05K 3/4644 174/257 |
| 2016/0254218 | A1* | 9/2016 | Hong | H01L 25/072 257/773 |
| 2017/0034917 | A1* | 2/2017 | Hongo | H05K 3/4061 |
| 2017/0141011 | A1 | 5/2017 | Oohiraki et al. | |
| 2017/0154855 | A1 | 6/2017 | Oi et al. | |
| 2017/0162481 | A1* | 6/2017 | Lin | H01L 23/142 |
| 2017/0265300 | A1 | 9/2017 | Huang et al. | |
| 2018/0102303 | A1* | 4/2018 | Mori | B32B 15/04 |
| 2018/0145007 | A1* | 5/2018 | Hatano | H01L 23/3675 |
| 2019/0002358 | A1* | 1/2019 | Zeiger | B32B 7/022 |
| 2019/0135706 | A1 | 5/2019 | Terasaki | |
| 2019/0222118 | A1* | 7/2019 | Xu | H02M 1/44 |

FOREIGN PATENT DOCUMENTS

| JP | S64-59986 A | 3/1989 |
|---|---|---|
| JP | H05-41566 A | 2/1993 |
| JP | H08-83864 A | 3/1996 |
| JP | H09-172231 A | 6/1997 |
| JP | 2003-258408 A | 9/2003 |
| JP | 2004-022710 A | 1/2004 |
| JP | 2008-010520 A | 1/2008 |
| JP | 2010-50164 A | 3/2010 |
| JP | 2015-185606 A | 10/2015 |
| TW | 201614020 A | 4/2016 |
| TW | 201626513 A | 7/2016 |
| TW | 201733416 A | 9/2017 |
| TW | 201821390 A | 6/2018 |
| WO | 2013/167123 A1 | 11/2013 |
| WO | 2016190440 A1 | 12/2016 |

OTHER PUBLICATIONS

International Search Report dated Mar. 26, 2019, issued for PCT/JP2019/002074.

Office Action dated Dec. 17, 2021, issued for Taiwan Patent Application No. 108102678.

* cited by examiner

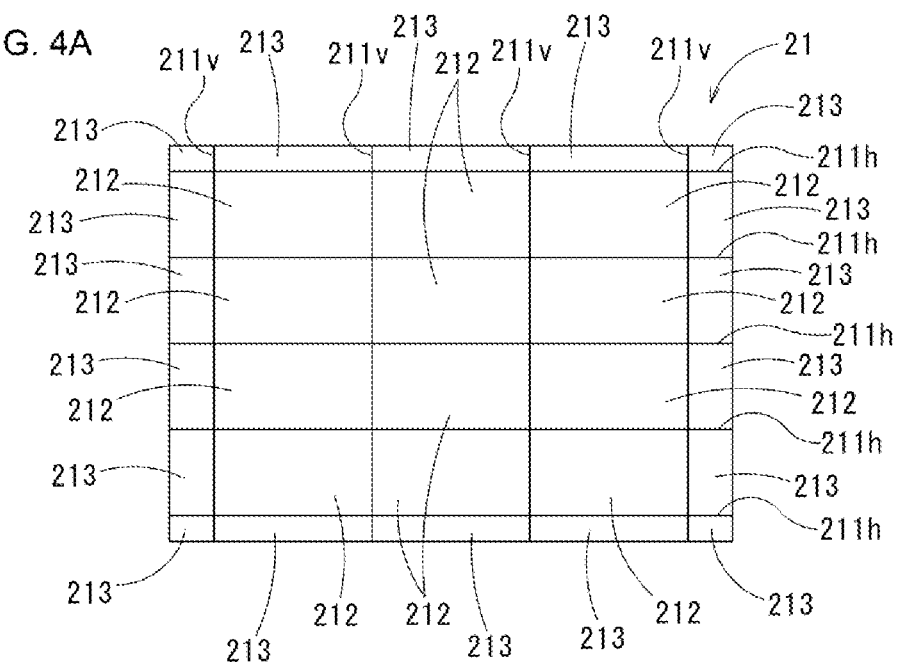
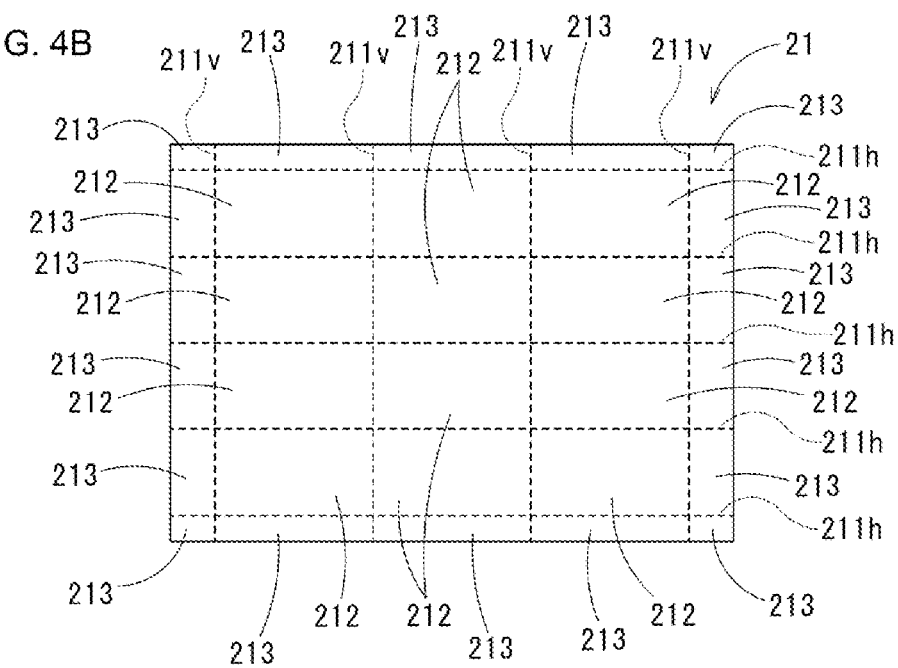

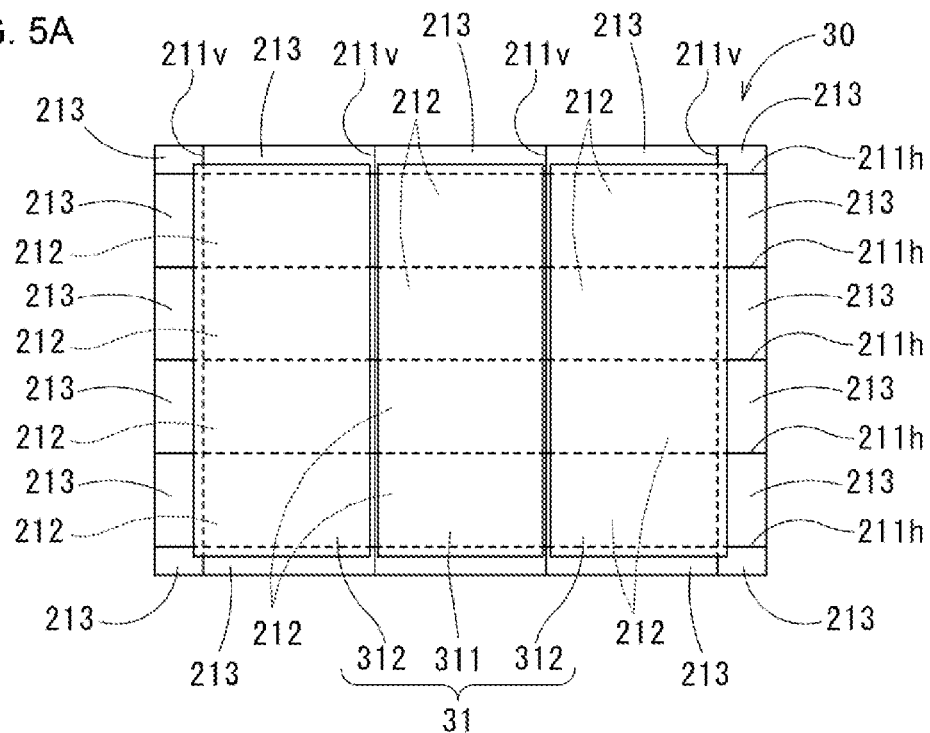
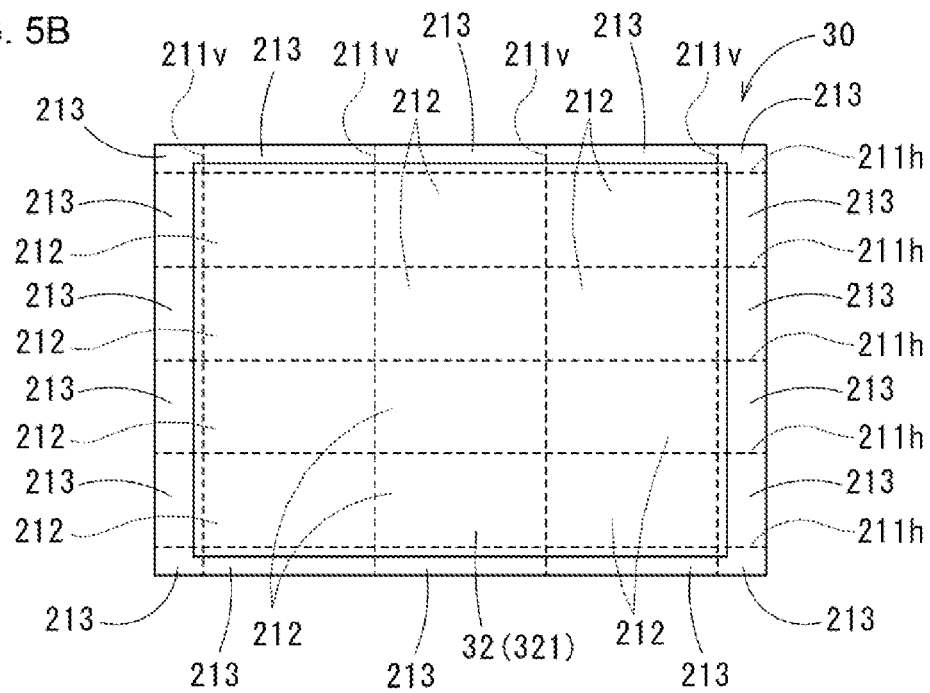

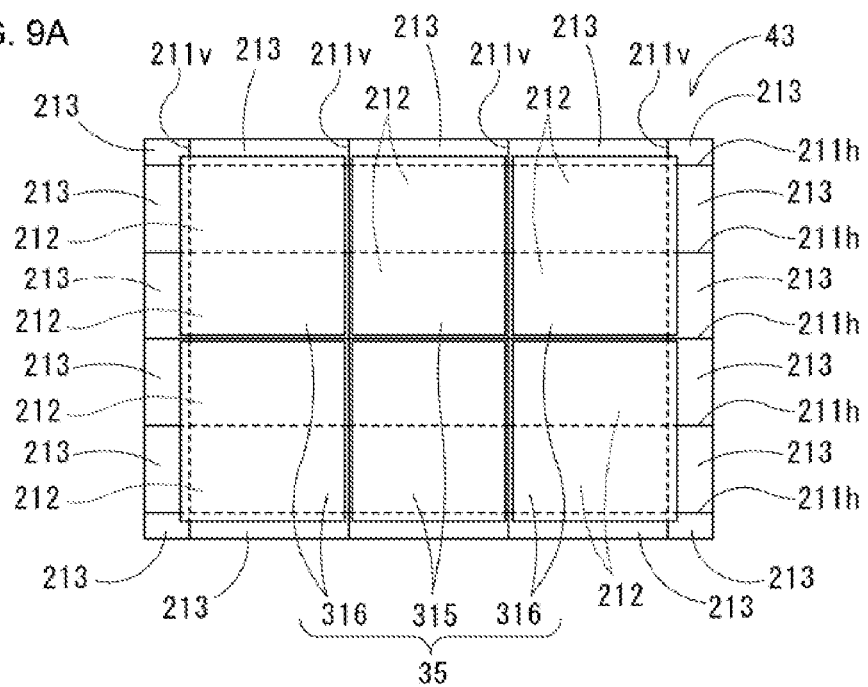
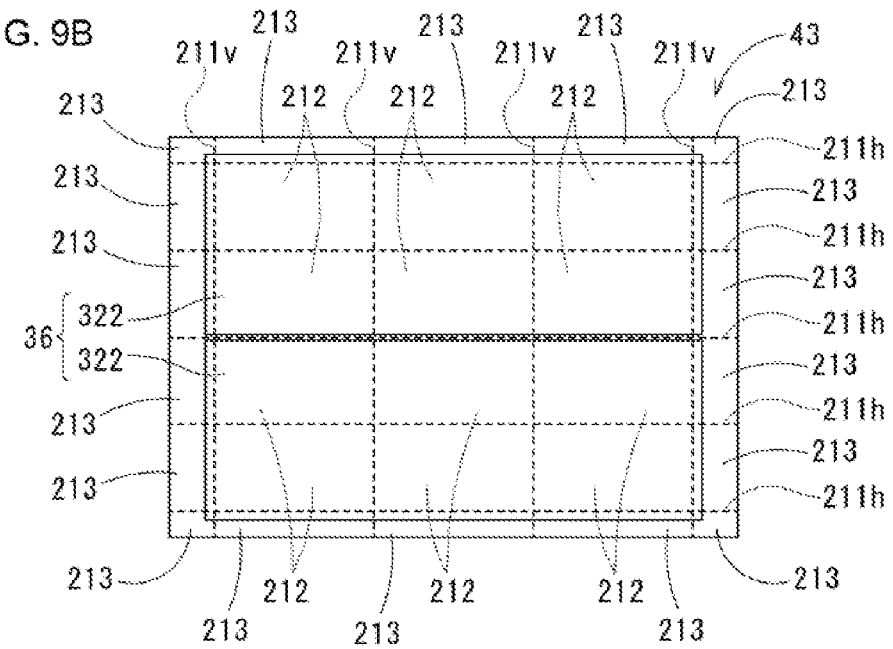

METHOD OF MANUFACTURING POWER MODULE SUBSTRATE BOARD AND CERAMIC-COPPER BONDED BODY

BACKGROUND OF THE INVENTION

Technical Field

The present invention relates to a method of manufacturing a power module substrate board used for manufacturing power modules and the like controlling large electric current and high voltage, and a ceramic-copper bonded body. Priority is claimed on Japanese Patent Application No. 2018-009275, filed Jan. 24, 2018, the content of which is incorporated herein by reference.

Background Art

As a method of manufacturing a power module substrate board used for power modules and the like, known is a method of manufacturing a plurality of power module substrate boards from one ceramic board having a large area which can be formed into a plurality of the power module substrate boards, as described in Patent Document 1 or Patent Document 2 for example, by forming dividing grooves (scribe lines) to partition into respective sizes of the power module substrate boards on the ceramic material to separate the ceramic material into pieces along the dividing grooves.

Patent Document 1 describes that a metal board made of aluminum or copper is brazed on a ceramic base material (a ceramic board) on which scribe lines are previously formed, then the metal board is etched so that a circuit patterns are formed.

Patent Document 2 describes that after a ceramic substrate board (a ceramic board) and a metal board made of aluminum are bonded, circuit patterns are formed by etching the metal board, and then grooves (dividing grooves) are formed between the circuit patterns on the ceramic substrate board.

CITATION LIST

Patent Document

Patent Document 1
Japanese Unexamined Patent Application, First Publication No. 2015-185606
Patent Document 2
Japanese Unexamined Patent Application, First Publication No. 2010-50164

SUMMARY OF INVENTION

Technical Problem

As described above, by using a ceramic board having a large area on which a plurality of power module substrate board can be formed, it is possible to manufacture the plurality of power module substrate board at once and improve productivity of the power module substrate boards.

However, by the method of producing the plurality of power module substrate boards using the ceramic material having the large area, because that the dividing grooves are formed on the ceramic board and the metal boards having different thicknesses are bonded on the front and back surfaces of the ceramic board, and so forth, stresses are different between front and back surfaces of the ceramic board and the bonded body of the ceramic board and the metal board is easy to be warped in the manufacturing process. If the bonded body warps, it may be necessary to flatten the bonded body by suction holding or the like, a thickness of a resist film may be uneven in a resist print, forms of resist patterns may be inferior and so on, when the circuit pattern is formed: and there are problems in which the circuit patterns are shifted, an inspection accuracy is deteriorated in an inspection step, and so forth.

In a circuit layer included in the power module substrate board, it is desirable that a thickness be relatively large (thick) in order to improve an effect of heat-spreading: by contrast, a metal layer (a heat-radiation layer) arranged on a back surface is formed to have a smaller thickness than that of the circuit layer, in order to balance with the circuit layer where the patterns will be formed and to reduce the warp in a whole. However, if the metal board on the circuit layer side is thicker than the metal board on the metal layer side before the circuit patterns are formed, the warp becomes large and the ceramic substrate board may be broken. For this point, by using a silicon nitride ($Si_3N_4$) board having high strength as the ceramic substrate board, it is possible to manufacture the bonded body in which the metal board forming the circuit layer is relatively thick: however, the warp of the bonded body is large.

Although copper is more suitable than aluminum for the metal board forming the circuit patterns and the like in a view point of electric conductivity and heat dissipation property; since copper has higher rigidity than that of aluminum, it is difficult to flatten a bonded body using copper if it warps when forming the circuit pattern, and accuracy of the circuit patterns is easy to be deteriorated.

In order to improve the productivity of the power module substrate boards, it is required for a size (an area) of the ceramic boards to be larger: however, in that case, the warp of the bonded body of the ceramic board and the copper board becomes larger in the manufacturing process, and there is a fear of further deterioration of the accuracy of the circuit patterns.

The present invention is achieved in consideration of the above circumstances, and has an object to provide a method of manufacturing power module substrate boards at high productivity and a ceramic-copper bonded body in which the warp is reduced.

BRIEF SUMMARY OF THE INVENTION

Solution to Problem

A method of manufacturing a power module substrate board of the present invention includes: a bonded body-forming step forming a bonded body having a ceramic board having a dividing groove for dividing into two or more ceramic substrate boards, a circuit layer-forming copper layer bonded on a first surface of the ceramic board, and a metal layer-forming copper layer bonded on a second surface of the ceramic board; a pattern-forming step forming a circuit layer and a metal layer on respective substrate board-forming areas of the ceramic substrate boards partitioned by the dividing groove, by etching on the bonded body after the bonded body-forming step; and a dividing step forming a plurality of the power module substrate boards including the ceramic substrate board, the circuit layer, and the metal layer, by dividing the ceramic board along the dividing groove after the pattern-forming step: in the bonded body-forming step, the circuit layer-forming copper layer consisting of first copper layers is formed by arranging and bonding first copper boards on the first surface of the ceramic board; and the metal layer-forming copper layer consisting of one or more second copper layers composed with a smaller arrangement number than that of the first copper layers is formed by bonding a second copper board on the second surface of the ceramic board; the second copper board having a larger planar area than a planar area of the first copper boards and a smaller thickness than that of the first copper boards; and the second copper board is bonded so as to cover at least two of adjacent substrate board-forming areas among the substrate board-forming areas partitioned by the dividing groove.

In the bonded body-forming step, although the copper boards having the different thickness are bonded on the front and back surfaces of the ceramic board, the thicker circuit layer-forming copper layer is composed of the first copper layer which are divided into several pieces (the first copper boards): accordingly, it is possible to reduce a difference of inner stress between the front and back surfaces of the ceramic board in a combination with the thinner metal layer-forming copper layer, and a warp in the bonded body (the ceramic-copper bonded body) of the ceramic board, the circuit layer-forming copper layer (the first copper boards), and the metal layer-forming copper layer (the second copper board) can be reduced.

Since the warp in the bonded body can be reduced as described above, in the pattern-forming step, defects of unevenness of the thickness of the resist film and the form of the resist pattern are not easily occurred, and the circuit layer and the metal layer can be patterned and formed accurately on the respective substrate board-forming areas. Accordingly, it is possible to manufacture the power module substrate boards at once with high accuracy and improve the productivity of the power module substrate boards.

As a preferred embodiment of the method of manufacturing power module substrate board of the present invention, it is preferable that in a combination of the single first copper layer and the single second copper layer which are opposed with the ceramic board therebetween, a thickness of the first copper layer is t1, a bonded area of the first copper layer and the ceramic board is A1, a thickness of the second copper layer is t2, and a bonded area of the second copper layer and the ceramic board is A2; a product of multiplying an area ratio (A1/A2) of the bonded area A1 and the bonded area A2 and a thickness ratio (t1/t2) of the thickness t1 and the thickness t2, $\{(A1/A2) \times (t1/t2)\}$ be not less than 0.080 and not more than 0.600.

The thickness t1 and the bonding area A1 of the first copper boards and the thickness t2 and the bonding area A2 of the second copper board are in the above mentioned relation, so it is possible to form the bonded body in which a warp is as small as the flatness of the metal layer-forming copper layer is not more than 0.5 mm. Accordingly, in the pattern-forming step, it is possible to form the circuit layer and the metal layer reliably which are patterned on the respective substrate board-forming areas of the ceramic substrate board with high accuracy.

Furthermore, the method of manufacturing power module substrate board of the present invention, it is preferable that a dividing groove-forming step be carried out before the bonded body-forming step: in this step, the dividing groove is formed on at least one of the first surface or the second surface of the ceramic board along outlines of the substrate board-forming areas.

A ceramic-copper bonded body of the present invention includes a ceramic board having a dividing groove for dividing into a plurality of ceramic substrate boards, a circuit layer-forming copper layer consisting of a plurality of first copper layers bonded on a first surface of the ceramic board, and a metal layer-forming copper layer consisting of one or more second copper layers with a smaller arrangement number than that of the first copper layers, bonded on a second surface of the ceramic board and having a larger planar area than that of the first copper layers and a smaller thickness than that of the first copper layers: among substrate board-forming areas of the ceramic substrate board partitioned by the dividing groove, the second copper layer covers at least two of the adjacent substrate board-forming area.

Advantageous Effects of Invention

According to the present invention, the warp of the ceramic-copper bonded body can be reduced, so that it is possible to form the circuit layer and the metal layer with high accuracy on the respective substrate board-forming areas of the ceramic board, and it is possible to improve the productivity of the power module substrate board.

BRIEF DESCRIPTION OF DRAWINGS

FIG. 3A is a frontal view; FIG. 3B is a top view viewed from a side of a circuit layer; and FIG. 3C is a bottom view viewed from a side of a metal layer.

FIG. 4A and FIG. 4B are plan views explaining dividing grooves formed on a ceramic board: FIG. 4A is a drawing in which a first surface of the ceramic board is toward a front side; and FIG. 4B is a drawing in which a second surface of the ceramic board is toward the front side.

FIG. 5A and FIG. 5B are plan views explaining a ceramic-copper bonded body: FIG. 5A is a drawing in which the first surface of the ceramic board is toward the front side; and FIG. 5B is a drawing in which the second surface of the ceramic board is toward the front side.

FIG. 6A is a drawing in which the first surface of the ceramic board is toward the front side; and FIG. 6B is a drawing in which the second surface of the ceramic board is toward the front side.

FIG. 8A is a drawing in which a first surface of a ceramic board is toward a front side; and FIG. 8B is a drawing in which a second surface of the ceramic board is toward the front side.

FIG. 9A and FIG. 9B are plan views showing a ceramic-copper bonded body of a fourth embodiment: FIG. 9A is a drawing in which a first surface of a ceramic board is toward a front side; and FIG. 9B is a drawing in which a second surface of the ceramic board is toward the front side.

DESCRIPTION OF EMBODIMENTS

Below, embodiments of the present invention will be explained with referring the drawings.

Figure 3A:
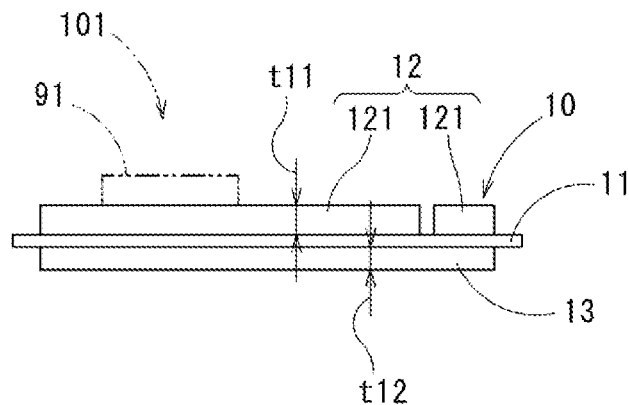
FIG. 3A, FIG. 3B and FIG. 3C are drawings explaining a structure of a power module substrate board manufactured by applying the method of manufacturing the power module substrate board of the first embodiment.
Figure 3B:
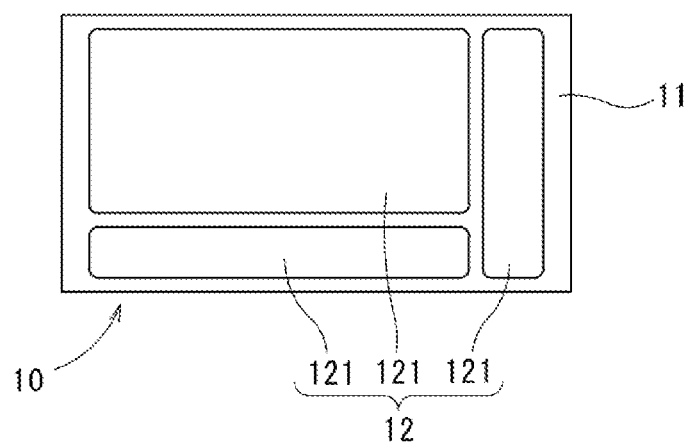
Figure 3C:
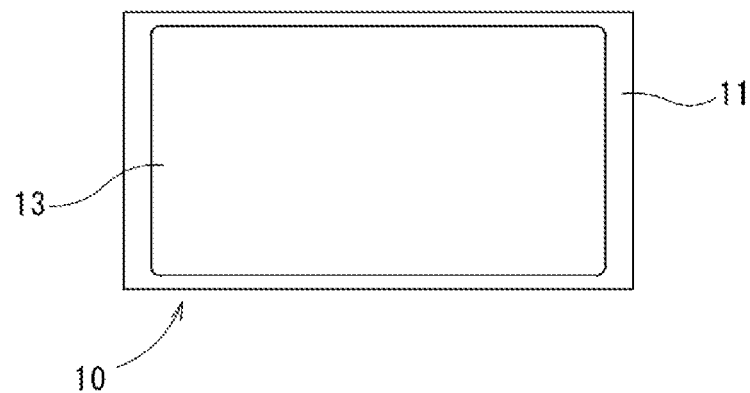

FIGS. 3A to 3C show a power module substrate board 10 manufactured by a method of manufacturing a power module substrate board according to a first embodiment of the present invention. A power module 101 is manufactured by installing (mounting) elements 91 such as semiconductor elements and the like on a surface (an upper surface in FIG. 3A) of the power module substrate board 10, as shown in FIG. 3A.

The power module substrate board 10 is provided with a ceramic substrate board 11, a circuit layer 12 formed on a first surface (the upper surface in FIG. 3A) of the ceramic substrate board 11, and a metal layer 13 formed on a second surface (a lower surface in FIG. 3A) of the ceramic substrate board 11, as shown in FIGS. 3A to 3C.

The ceramic substrate board 11 is made of ceramic material such as MN (aluminum nitride), $Al_2O_3$ (alumina), $Si_3N_4$ (silicon nitride), or the like.

The circuit layer 12 is formed by bonding copper boards made of copper (copper or copper alloy) on the first surface of the ceramic substrate board 11 by brazing or the like. The metal layer 13 is formed by bonding a copper board made of copper (copper or copper alloy) on the second surface of the ceramic substrate board 11 by brazing or the like, as the circuit layer 12.

As shown in FIG. 3B, the circuit layer 12 is formed from a plurality of small circuit layers 121 and forms circuit patterns. Consequently, a bonding area of the ceramic substrate board 11 and the circuit layer 12 is smaller than a bonding area of the ceramic substrate board 11 and the metal layer 13. As shown in FIG. 3A, a thickness (a board thickness) t11 of the circuit layer 12 is larger (thicker) than a thickness (a board thickness) t12 of the metal layer 13. As mentioned above, in the power module substrate board 10, a form of the metal layer 13 is adjusted considering the circuit layer 12 in order to reduce a difference of inner stress by a difference of thermal expansion between the circuit layer 12 and the metal layer 13 which are bonded on both surfaces of the ceramic substrate board 11 respectively.

For example of dimensions of the power module substrate board 10, a thickness (a board thickness) of the ceramic substrate board 11 made of $Si_3N_4$ (silicon nitride) is 0.1 mm to 1.5 mm; the thickness t11 of the circuit layer 12 made of OFC (pure copper) is 0.5 mm to 2.0 mm; and the thickness t12 of the metal layer 13 also made of OFC is 0.35 mm to 1.8 mm. However, these dimensions are not limited to the above value ranges.

The elements 91 mounted on the power module substrate board 10 are electric components having semiconductor: in accordance with required functions, various semiconductors are selected such as IGBT (Insulated Gate Bipolar Transistor), MOSFET (Metal Oxide Semiconductor Field Effect Transistor), FWD (Free Wheeling Diode), and the like. In the elements 91, a top electrode part is provided at a top and a bottom electrode part is provided at a bottom, although the illustration is omitted. The elements 91 are mounted on an upper surface of the circuit layer 12 by the bottom electrode parts of the elements 91 are bonded on the upper surface of the circuit layer 12 by soldering or the like. The top electrode parts of the elements 91 are connected to a circuit electrode part or the like of the circuit layer 12 via lead frames (not illustrated).

Next, a method of manufacturing the power module substrate board 10 will be explained. The method of manufacturing the power module substrate board of the present embodiment is composed of a plurality of manufacturing steps S11 to S13 as shown in a flow drawing in FIG. 2. FIG. 1 shows FIG. 1A, FIG. 1B, FIG. 1C and FIG. 1D show an instance of manufacturing steps of the method of manufacturing the power module substrate board of the present embodiment. Below, it will be explained in order of the steps.

—Dividing Groove-Forming Steps—

On at least one of a first surface or a second surface of a ceramic board 21, dividing grooves 211v and 211h are formed along boundary lines of a plurality of substrate board-forming areas by linearly removing the surface(s) of the ceramic board 21 to a middle in a thickness direction. Namely, the large ceramic board 21 having the dividing grooves 211v and 211h for dividing into the plurality of ceramic substrate boards 11 as shown in FIGS. 4A and 4B is prepared. FIG. 4A is a plan view of the first surface of the ceramic board 21. FIG. 4B is a plan view showing the second surface of the ceramic board 21. The dividing to grooves 211v and 211h are formed on at least one surface (the first surface) of the ceramic board 21.

In the present embodiment, the dividing grooves 211v and 211h are formed only on the first surface of the ceramic board 21 as shown in FIG. 4A: the dividing grooves 211v and 211h formed on the first surface of the ceramic board 21 are denoted by broken lines in FIG. 4B. The dividing grooves 211v and 211h may be formed only on the second surface of the ceramic board 21, and may be formed on both the first surface and the second surface.

As described above, the ceramic board 21 is partitioned by the dividing grooves 211v and 211h formed on the surface thereof, so that a plurality (twelve in FIGS. 4A and 4B) of substrate board-forming areas 212 which will be the ceramic substrate boards 11 are formed on the surface. The dividing grooves 211v and 211h can be formed by removing the surface of the ceramic board 21 linearly by laser machining, dicing, and the like, for example.

The dividing grooves 211v and 211h are formed by straight lines connecting opposed sides of the ceramic board 21 to each other, as shown in FIG. 4A. In FIG. 4A, on the ceramic board 21, the four dividing grooves 211v with even interval are formed extending vertically and connecting long sides with each other; and the five dividing grooves 211h with even interval are formed extending horizontally and connecting short sides with each other. The substrate board-forming areas 212 partitioned into a size of the outline of the ceramic substrate board 11 by the nine dividing grooves 211v and 211h are formed with aligned in four vertical rows and three horizontal rows: twelve in total.

On a peripheral part of the ceramic board 21, margin areas 213 having a small area are partitioned enclosing around the twelve substrate board-forming areas 212. The margin areas 213 are not used for the ceramic substrate board 11 and removed in a dividing step S13 mentioned below.

—Bonded Body-Forming Step S11—

In the bonded body-forming step S11, a circuit layer-forming copper layer 31 is formed as shown in FIG. 5A on the first surface of the ceramic board 21 composed as above, and a metal layer-forming copper layer 32 is formed on the second surface of the ceramic board 21 as shown in FIG. 5B; thereby a ceramic-copper bonded body 30 (hereinafter, it is omitted as a bonded body 30) having the ceramic board 21, the circuit layer-forming copper layer 31, and the metal layer forming-copper layer 32 are formed.

Figure 1A:
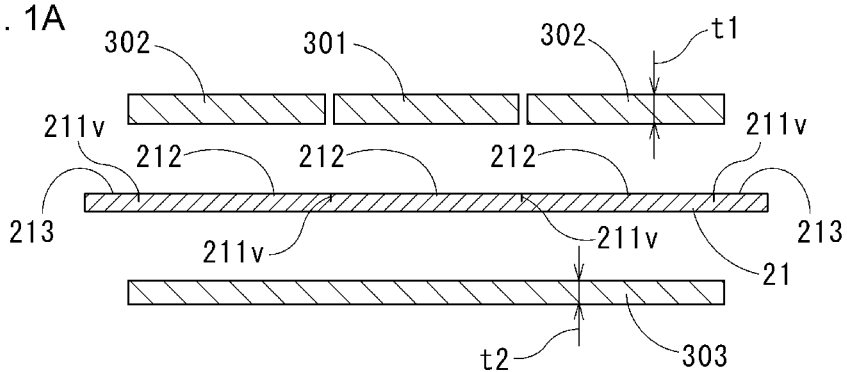
FIG. 1A, FIG. 1B, FIG. 1C and FIG. 1D are cross sectional views view showing a method of manufacturing a power module substrate board of a first embodiment of the present invention in order of steps.
Figure 1B:
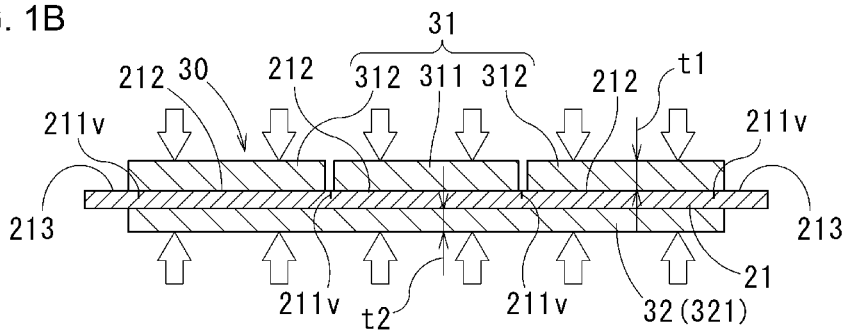
Figure 2:
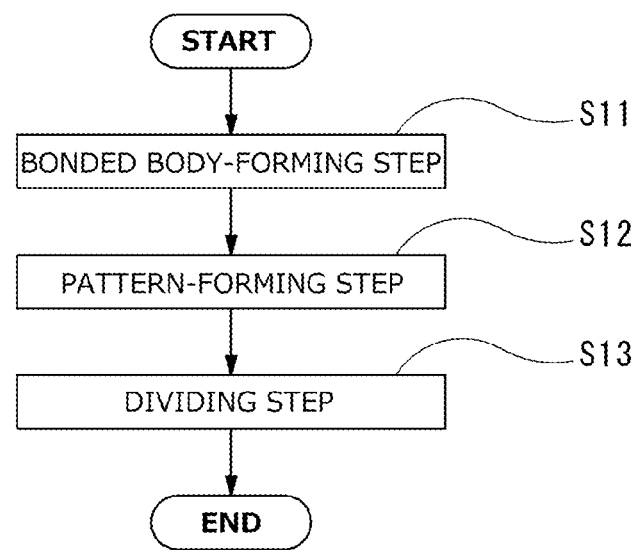
FIG. 2 is a flow drawing explaining the method of manufacturing the power module substrate board of the first embodiment.

As shown in FIG. 1A, by bonding a plurality (three in the illustrated example) of first copper boards 301 and 302 even on the first surface of the ceramic board 21, a circuit layer-forming copper layer 31 formed of a plurality of first copper layers 311 and 312 is formed as shown in FIG. 1B and FIG. 5A. Similarly, by bonding a second copper board 303 on the second surface of the ceramic board 21 as shown in FIG. 1A, the metal layer-forming copper layer 32 composed of a second copper layer 321 with a smaller arrangement number (one in the illustrated example) than the arrangement number of the first copper layers 311 and 312 is formed as shown in FIG. 1B and FIG. 5B.

Bonding of these first copper boards 301 and 302, the second copper board 303, and the ceramic board 21 are carried out using brazing bonding material (not illustrated) such as Ag—Cu—Ti type brazing material for example. The brazing bonding material is easy to be handled by spreading in advance on respective bonding surfaces of the first copper boards 301 and 302 and the second copper board 303.

The first copper boards 301 and 302 and the second copper board 303 are formed into desired outer forms respectively by punching a material board made of copper or copper alloy by press machining for example. In the present embodiment, the first copper boards 301 and 302 are provided three in total: each single planar area of the first copper boards 301 and 302 is larger than a total of respective planar areas of the four substrate board-forming areas 212 aligned in the vertical direction of the ceramic board 21 (sum of the planar areas of the substrate board-forming areas 212, covered by the first copper boards 301 and 302 respectively): those are formed in sizes having rectangular form so that both end parts in the vertical direction span the upper and lower margin areas 213 (refer to FIG. 5A). Among these, the first copper boards 302 arranged on the left and right (both sides of the width direction) in FIG. 1A are larger in the left and right (a lateral direction) than the first copper board 301 arranged on a center and formed so as to span the margin areas 213 arranged in the peripheral edge parts of the ceramic board 21.

The second copper board 303 is provided with one in the present embodiment: a planar area of the second copper board 303 is larger than a planar area entirely covering the twelve substrate board-forming areas 212 aligned in the vertical and horizontal directions of the ceramic board 21; and the second copper board 303 is formed to span the margin areas 213 enclosing around these substrate board-forming areas 212 (refer to FIG. 5B). The second copper board 303 is larger in the planar area than the respective planar areas of the first copper boards 301 and 302 and formed to have a smaller thickness (thinner) than the first copper boards 301 and 302. Moreover, the planar area of the second copper board 303 is formed to be larger than the total area of the planar areas of the three first copper boards 301 and 302.

In this case, assuming the thickness (the board thickness) of the respective first copper boards 301 and 302 which will be the first copper layers 311 and 312 to be t1, the planar area (a bonding area) of one bonding surface of the respective first copper board 301 and first copper board 302 to be A1, the thickness (the board thickness) of the second copper board 303 which will be the second layer 321 to be t2, and the planar area (the bonding area) of the bonding surface of the second copper board 303 to be A2; it is desirable to adjust a relation of the thickness t1 and the bonding area A1 of the first copper board 301 and the first copper boards 302, and the thickness t2 and the bonding area A2 of the second copper board 303 so that a relation $\{(A1/A2)\times(t1/t2)\}$ that is a product of an area ratio (A1/A2) of the bonding area A1 and the bonding area A2 and a thickness ratio (t1/t2) be not less than 0.080 and not more than 0.600.

As described above, by adjusting the area and thickness of the copper boards 301, 302, and 303, it is possible to form the bonded body 30 with small warps in which a flatness of the metal layer-forming copper layer 32 is not more than 0.5 mm. In this case, it is desirable that the area ratio (A1/A2) of the bonding area A1 of the first copper boards 301 and 302 and the bonding area A2 of the second copper board 303 be less than 0.5. The thickness ratio (t1/t2) of the thickness t1 of the first copper boards 301 and 302 and the thickness t2 of the second copper board 303 is a value more than 1.0 because the thickness t2 is less (thinner) than the thickness t1.

The first copper boards 311 and 312, which form the circuit layer-forming copper layer 31, are formed by bonding the first copper boards 301 and 302 on the ceramic board 21; thus the first copper layers 311 and 312 have substantially the same thickness as the thickness t1 of the first copper boards 301 and 302, and the bonding area of the first copper layers 311 and 312 and the ceramic board 21 is also the same as the planar area (the bonding area) A1 of the bonding surface of the first copper board 301 and 302. Similarly, the second copper layer 321 is formed by bonding the second copper board 303 on the ceramic board 21, so that the second copper layer 321 has substantially the same thickness as the thickness t2 of the second copper board 303: the bonding area of the second copper layer 321 and the ceramic board 21 is also the same as the planar area (the bonding area) A2 of the second copper board 303.

Accordingly, in the present embodiment, the thickness of the first copper layers 311 and 312 is treated as the same thickness t1 as of the first copper boards 301 and 302, and the bonding area of the first copper layers 311 and 312 are treated as the same area A1 as the planar area (the bonding area) A1 of the first copper board 301 and 302. Similarly, the thickness of the second copper layer 321 is treated as the thickness t2 as that of the second copper board 303, and also the bonding area of the second copper layer 321 is treated as the same area A2 as the planar area (the bonding area) A2 of the bonding surface of the second copper board 303.

In the present embodiment, the first copper boards 301 arranged on a center of the ceramic board 21 and the first copper boards 302 arranged on the left and right are formed of copper boards having the different planar area A1. Therefore, the first copper board 301 arranged at the center of the ceramic board 21 and the first copper boards 302 arranged at the left and right of the ceramic board 21 are respectively adjusted for the relation with the second copper board 303. Namely, they are adjusted for the relation between the center first copper board 301 and the second copper board 303, and the relation between the left and right first copper boards 302 and the second copper boards 303, which are respectively in a position relation opposed to each other with the ceramic board 21 therebetween.

As described above, by taking the respective relations between the first copper boards 301 and 302 and the second copper board 303 which are arranged to be opposed with the ceramic board 21 therebetween into consideration, in a combination of the copper layers 311, 312, and 321 and the second copper layer 321 which are bonded on local areas of the ceramic board 21, it is possible to compose a symmetry structure centering the ceramic board 21 and reduce the warps of the bonded body 30. The thicknesses t1 and the bonding areas A1 of the respective first copper boards 301 and 302 (the first copper layers 311 and 312) are not necessarily the same: in the relation to the opposed second copper board 303 (the second copper layer 321), it is sufficient to adjust the relation into a range $\{(A1/A2) \times (t1/t2)\}$ being not less than 0.080 and not more than 0.600.

For example, examined is a following case: the thickness t1 of the first copper boards 301 and 302 is 0.8 mm; the planar area (the bonding area) A1 of the first copper board arranged on the center of the ceramic board 21 is (84 mm×64.5 mm); the plane are (the bonding area) A1 of the first copper boards 302 arranged on the left and right side of the ceramic board 21 is a rectangle board form (84 mm×64.5 mm); and the thickness t2 of the second copper board 303 is 0.7 mm and the planar area (the bonding area) A2 is a rectangle board form (171 mm×126 mm).

In this case, in the relation between the first copper board 301 arranged on the center of the ceramic board 21 and the second copper board 303 arranged to be opposed to the first copper board 301 with the ceramic board 21 therebetween, a thickness ratio is $(t1/t2)=1.14$, an area ratio is $(A1/A2)=0.2$, and a relational expression is $\{(A1/A2) \times (t1/t2)\}=0.27$.

In the relation between the first copper boards 302 arranged on the left and right of the ceramic board 21 and the second copper board 303 arranged to be opposed to the first copper boards 302 with the ceramic board 21 therebetween, a thickness ratio is $(t1/t2)=1.14$, an area ratio is $(A1/A2)=0.24$, and a relational expression is $\{(A1/A2) \times (t1/1t2)=0.27$.

As shown in FIG. 1A, the first copper boards 301 and 302 are arranged to be laminated on the first surface of the ceramic board 21 with the brazing bonding material (not illustrated) therebetween in order to bond the first copper boards 301 and 301 to the ceramic board 21 and bond the second copper board 303 to the ceramic board 21. Similarly, the second copper board 303 is arranged to be laminated on the second surface of the ceramic board 21 with the brazing bonding material (not illustrate) therebetween.

At this time, the first copper boards 301 and 302 are arranged avoiding the two dividing grooves 211v so as to bare the center two of the four dividing grooves 211v vertically extending on the ceramic board 21. Therefore, the first copper board 301 and 302 can be reliably bonded on positions including the circuit layer 12 formed in a pattern-forming steps S12. The three first copper boards 301 and 302 are arranged evenly on the first surface of the ceramic board 21 by disposing symmetry at the left and right as shown in FIG. 1A.

The second copper board 303 is arranged so as to match a center position of the second surface of the ceramic board 21 and a center position of the bonding surface of the second copper board 303 and to cover the all twelve substrate board-forming areas 212 partitioned on the ceramic board 21. The second copper board 303 is arranged to evenly cover the second surface of the ceramic board 21. The second copper board 303 is arranged at a position matching the three first copper boards 301 and 302 with the ceramic board 21 therebetween.

In this state, a laminated body of the first copper boards 301 and 302, the ceramic board 21, and the second copper board 303 is heated while adding load in a lamination direction of them as shown by white arrows in FIG. 1B. Thus the circuit layer-forming copper layer 31 formed from three first copper layers 311 and 322 is formed, by bonding the first copper boards 301 and 302 on the first surface of the ceramic board 21. Concurrently, the metal layer-forming copper layer 32 formed from the single second copper layer 321 is formed by bonding the second copper board 303 on the second surface of the ceramic board 21. Thus, the bonded body 30 having the ceramic board 21, the circuit layer-forming copper layer 31, and the metal layer-forming copper layer 32 is formed as shown in FIG. 1B, FIGS. 5A and 5B.

As described above, in the bonded body-forming step S11, on the front and back surfaces (the first surface and the second surface) of the ceramic board 21, the first copper boards 301 and 302 and the second copper board 303 having different thicknesses respectively are bonded; so that the circuit layer-forming copper layer 31 having the larger (thicker) thickness on the first surface of the ceramic board 21 is formed; and the metal layer-forming copper layer 32 having the smaller (thinner) thickness is formed on the second surface of the ceramic board 21 than the circuit layer-forming copper layer 31.

In the bonded body 30, the circuit layer-forming copper layer 32 having the large thickness is composed of the first copper layers 311 and 312 which are separated; and the metal layer-forming copper layer 32 having the smaller thickness is composed of the second copper layer 321 having the smaller arrangement number than that of the first copper layers 311 and 312: accordingly, in the combination of the copper layers 311, 312, and 321 bonded on the front and back surfaces of the ceramic board 21, a symmetry structure centering the ceramic board 21 can be formed. As a result, it is possible to reduce the difference between the inner stresses in the front and back surfaces of the ceramic board 21 and reduce the warps of the bonded body 30.

—Pattern-Forming Steps S12—

Figure 1C:
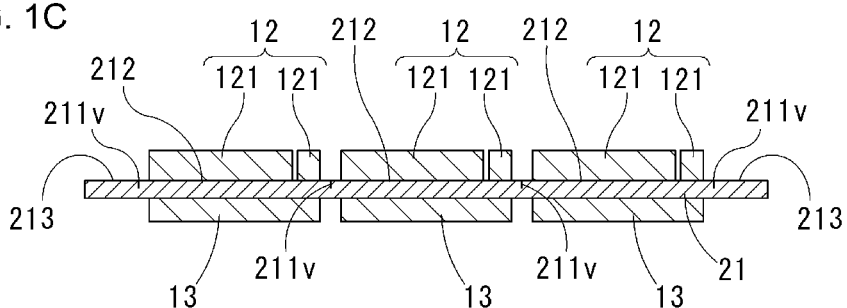
Figure 6A:
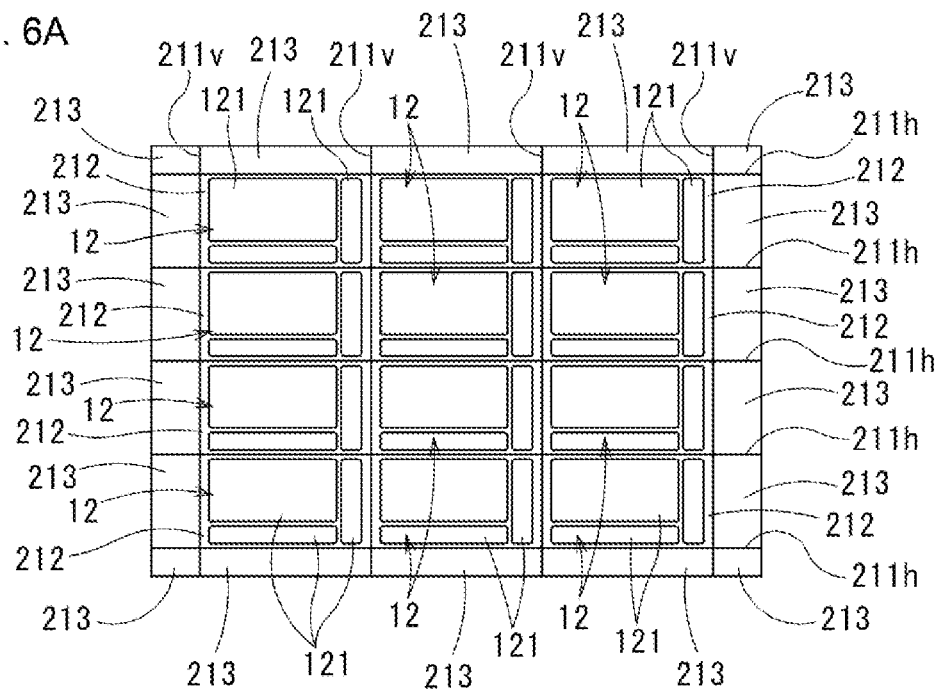
FIG. 6A and FIG. 6B are plan views explaining the patters of the circuit layer and the metal layer formed in a pattern-forming steps.
Figure 6B:
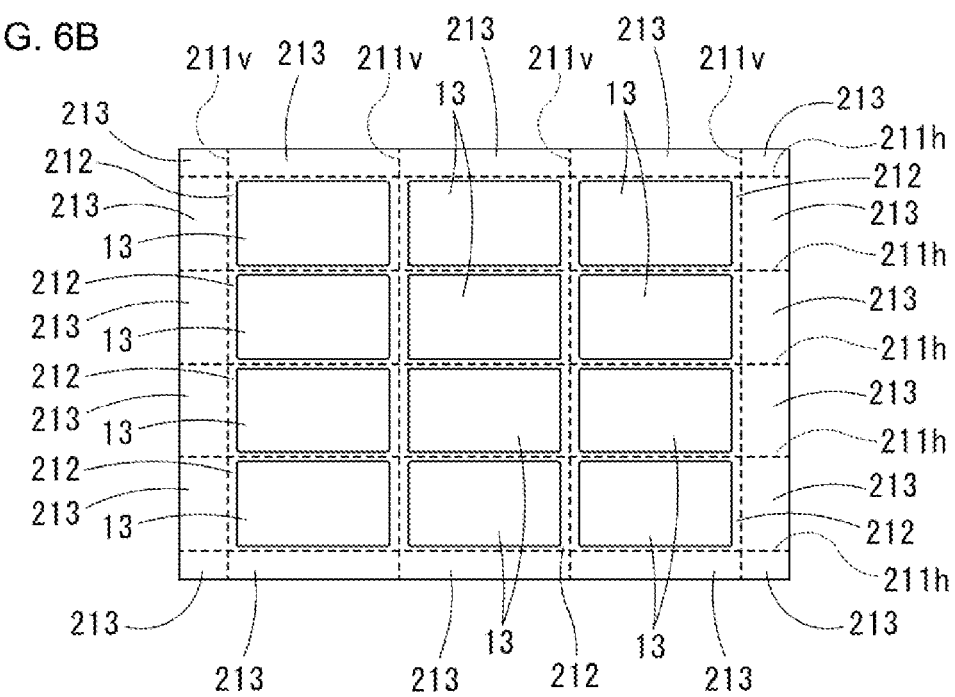

After the bonded body-forming step S11, the bonded body 30 is etched so as to form the circuit layer 12 and the metal layer 13 which are patterned in the respective substrate board-forming areas 212 on the ceramic board 21, as shown in FIG. 1C, FIGS. 6A and 6B. The etching can be carried out by known methods. For example, after masking such as applying a resist or pasting a masking tape and the like, etchant such as ferric chloride is in contact with parts in which the copper layers that is not masked are bared and removes to make patterns.

In this case, by patterning the circuit layer-forming copper layer 31 consisting of the first copper layers 311 and 312 disposed on the first surface of the ceramic board 21, formed is the circuit layer 12 composed of the separated plurality of small circuit layers 121 on the respective substrate board-forming areas 212, as shown in FIG. 6A. By patterning the metal layer-forming copper layer 32 consisting of the second copper layer 321 disposed on the second surface of the ceramic board 21, the metal layers 13 are formed separately in the respective substrate board-forming areas 21, as shown in FIG. 6B. In the pattern-forming steps S12, the parts of the copper layers 311, 312, and 321 on the dividing grooves 211v and 211h are removed, so that the dividing grooves 211v and 211h are entirely bared.

As described above, since the warp of the bonded body 30 formed by the bonded body-forming step S11 is reduced, a thickness of the resist film or a pattern form of the resist are not easily inferior in the pattern-forming steps S12. Accordingly, the circuit layer 12 and the metal layer 13 which are patterned can be accurately formed in the respective substrate board-forming areas 212.

—Dividing Step S13—

Figure 1D:
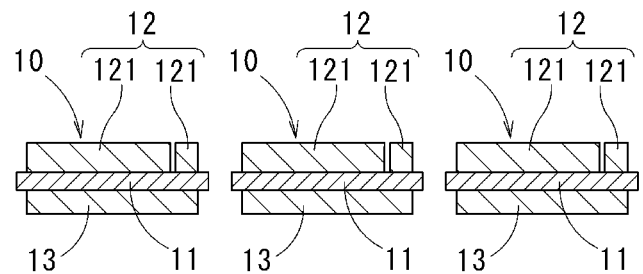

After the pattern-forming steps S12, as shown in FIG. 1D, the ceramic board 21 is divided along the dividing grooves 211v and 211h into pieces of the respective substrate board-forming areas 212; and the margin areas 213 are separated from the substrate board-forming areas 212. Then, as shown in FIGS. 3A to 3C, a plurality (twelve in the present embodiment) of the power module substrate boards 10 having the ceramic substrate board 11, the circuit layer 12, and the metal layer 13 are manufactured.

As described above, in the method of manufacturing the power module substrate boards of the present embodiment, the first copper boards 301 and 302 and the second copper board 303 having the different thicknesses are bonded respectively on the front and back surfaces of the large plane ceramic board 21: however, since the thick circuit layer-forming copper layer 31 is composed of the segmented first copper layers 311 and 312 (the first copper boards 301 and 302), in the combination with the thin metal layer-forming copper layer 32 (the second copper board 303), it is possible to reduce the difference of the inner stresses on the front and back surface of the ceramic board 21, and the warps in the bonded body 30 in which the ceramic board 21, the circuit layer-forming copper layer 31 and the metal layer-forming copper layer 32 are bonded.

It is possible to form the small bonded body 30 of which the warp is small in which a flatness of the metal layer-forming copper layer 32 is not more than 0.5 mm by adjusting the thickness t1 and the bonding area A1 of the first copper layer 311 and 312, and the thickness t2 and the bonding area A2 of the second copper layer 321 to satisfy $\{(A1/A2) \times (t1/t2)\}$ to be not less than 0.080 and not more than 0.600, which is the product of area ratio (A1/A2) and the thickness ratio (t1/t2).

Since the warps of the bonded body 30 can be reduced as described above, in the pattern-forming steps S12, the unevenness in the thickness of the resist film nor the defects of the form of the resist patterns are not easily generated, so that the circuit layer 12 and the metal layer 13 which are patterned in the respective substrate board-forming areas 212 can be accurately formed. Accordingly, a plurality of the power module substrate boards 10 can be accurately manufactured all together, and the productivity of the power module substrate boards 10 can be improved.

The present invention is not limited to the above-described embodiments and various modifications may be made in details or particulars without departing from the scope of the present invention.

Figure 7:
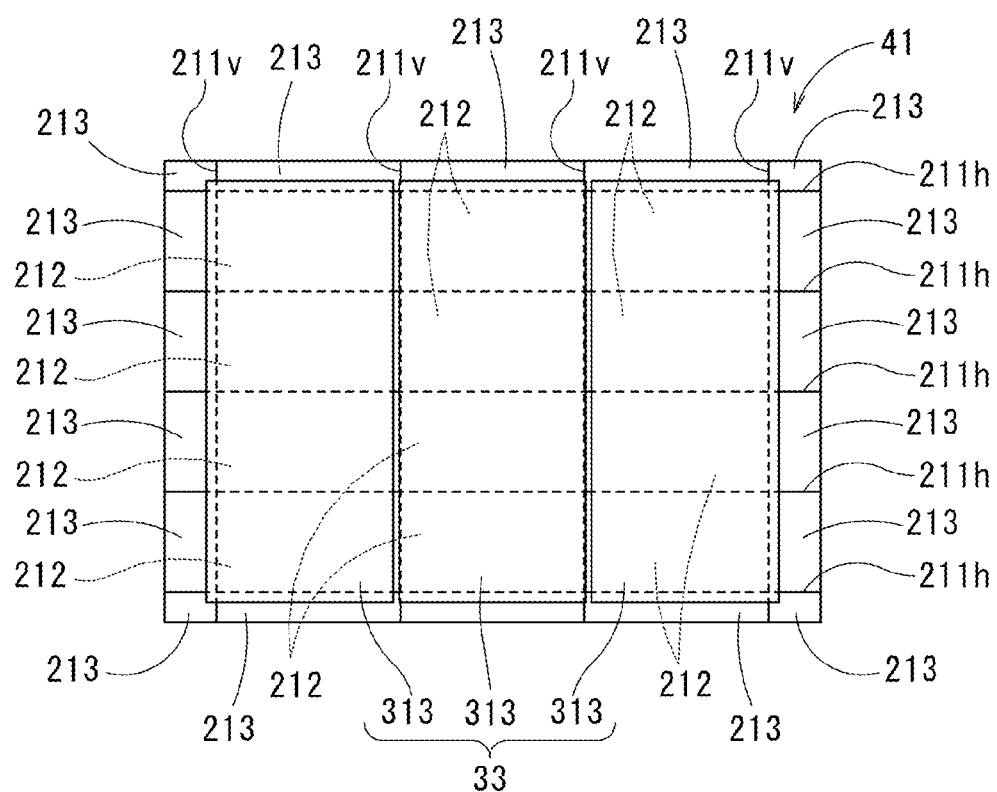
FIG. 7 is a plan view showing a ceramic-copper bonded body of a second embodiment; it shows a drawing in which a first surface of a ceramic board is toward a front side.

For example, in the first embodiment, the three first copper boards 301 and 302 are formed with the different form between the center first copper board 301 and the left and right first copper boards 302; however, as in a bonded body 41 of a second embodiment shown in FIGS. 7A and 7B, it is applicable to compose the circuit layer-forming copper layer 33 having the first copper boards 313 with a same form by forming the three first copper boards in the same form. It is not essential to bare the dividing grooves 211v of the ceramic board 21 between the first copper layers 313, but it is sufficient to bond the respective first copper layers 313 in accordance with a form of the patterns of the circuit layer 12 formed by the pattern-forming steps S12, in other words, on positions in which the circuit layer 12 is reliably included.

Figure 8A:
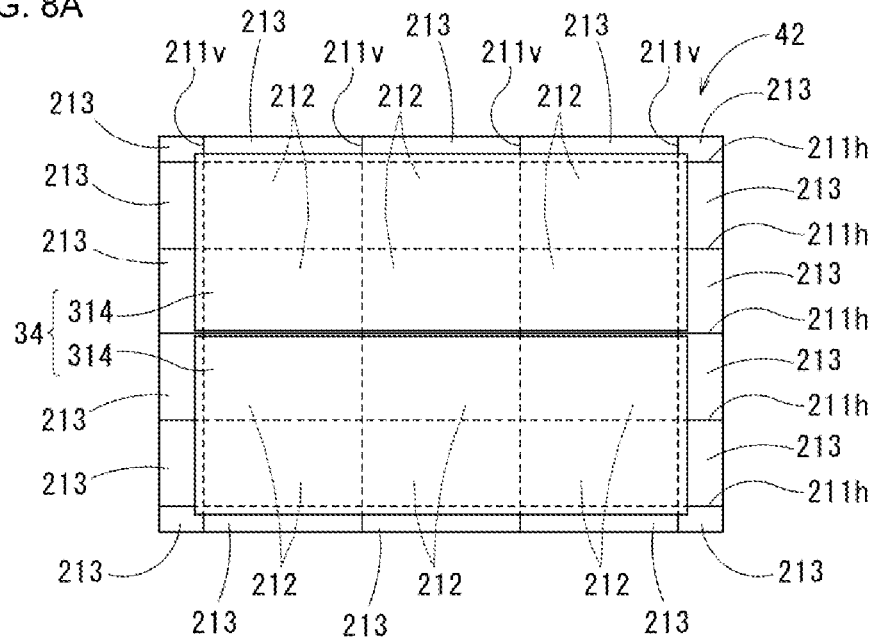
FIG. 8A and FIG. 8B are plan views showing a ceramic-copper bonded body of a third embodiment.
Figure 8B:
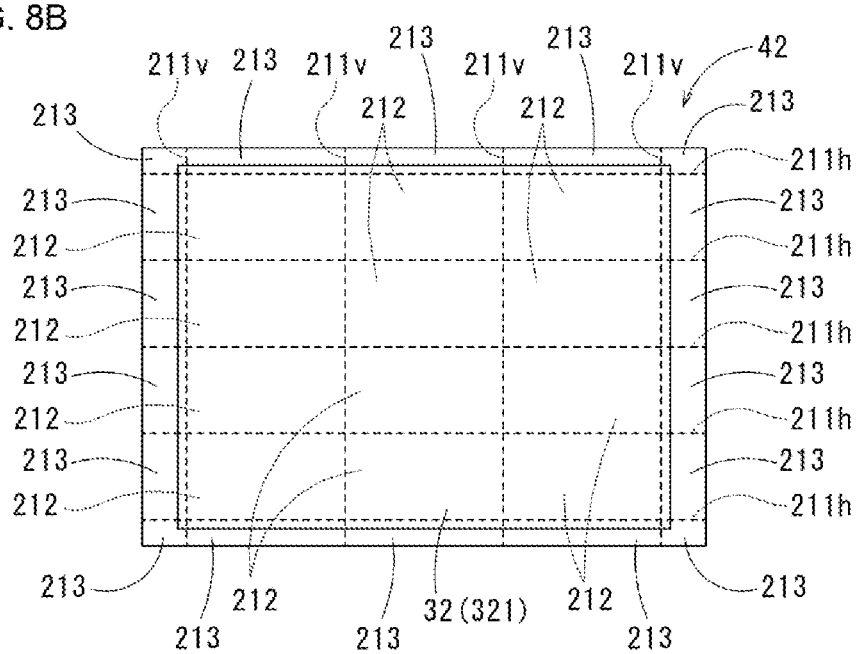

The arrangement number of the first copper layer configuring the circuit layer-forming copper layer is not limited to three. For example, a bonded body 42 of a third embodiment is shown in FIGS. 8A and 8B. As shown in FIG. 8A, a structure in which first copper layers 314 are separated in two is also applicable. In this case, as shown in FIG. 8B, an arrangement number of the second copper layer 321 is one, smaller than an arrangement number of first copper layers 314. Also in this case, by adjusting a thickness t1 and a bonding surface A1 of the first copper layers 314 and a thickness t2 and a bonding area A2 of the second copper layer 321, it is possible to forming a symmetry structure centering the ceramic board 21, so that a warp of the bonded body 42 can be reduced.

As in a bonded body 43 according to a fourth embodiment shown in FIGS. 9A and 9B, an arrangement number of the first copper layers is not limited to two or three. As shown in FIG. 9A, it is applicable that an arrange number of first copper layers 315 and 316 is six in total; and the bonded body 43 may be composed by providing circuit layer-forming copper layers 35 with an arrangement number more than three. An arrangement number of second copper layers configuring a metal layer-forming copper layer is not limited to one: a metal layer-forming copper layer 36 can be composed of a smaller arrangement number of second copper layers 322 than the total arrangement number of the first copper layer 315 and 316; for example, the second copper layers 322 is two as shown in FIG. 9B.

EXAMPLES

Below, effects of the present invention will be explained in details using examples, but the present invention is not limited to the following examples.

For members configuring Invention Examples 1 to 7 and Comparative Examples 1 and 2, a ceramic board made of $Si_3N_4$ with a board thickness 0.32 mm and a first copper board and a second copper board made of OFC (pure copper) were prepared.

The ceramic board was prepared to have two plane sizes, which were 190.8 mm vertical×138 mm horizontal (invention Examples 1, 4, and 6 and Comparative Example 1) and 100 mm vertical×120 mm horizontal (Invention Examples 2, 3, 5, 7, and 8). In order to accurately evaluate the warp of bonded bodies in accordance to combinations of the circuit layer-forming copper layer and the metal layer-forming copper layer, the plane form ceramic board in which the dividing grooves were not formed was used.

The first copper boards which would be the first copper layer and the second copper boards which would be the second copper layer were prepared with the arrangement number shown in Table 1 to have the plane size (vertical and lateral) and the thicknesses t1 and t2 shown in Table 1. These were bonded together by the manufacturing method in the first embodiment, and test pieces of the bonded body (the ceramic-copper bonded body) having the ceramic board and the copper layers (the circuit layer-forming copper layer and the metal layer-forming copper layer) were made.

The first copper board and the second copper board were aligned on the respective bonding surface of the ceramic board so as to be symmetrical in up and down and symmetrical in left and right, and evenly arranged. "a×b" in Table 2 denotes a value of $\{(A1/A2) \times (t1/t2)\}$, that is a product of multiplying an area ratio "a"=(A1/A2) and a thickness ratio "b"=(t1/t2).

Regarding the obtained test pieces, the flatness in normal temperature (25° C.) was measured after bonding. The flatness was measured by a moiré-type three-dimensional form measuring device on a surface of the metal layer-forming copper layer.

Results are shown in Table 2.

TABLE 1

| Example | | FIRST COPPER LAYER | | | | SECOND COPPER LAYER | | | |
| --- | --- | --- | --- | --- | --- | --- | --- | --- | --- |
| | | VERTICAL (mm) | HORIZON-TAL (mm) | ARRANGE-MENT NUMBER | THICKNESS 11 (mm) | VERTICAL (mm) | HORIZON-TAL (mm) | ARRANGE-MENT NUMBER | THICKNESS 12 (mm) |
| INVEN-TION EXAMPLE | 1 | 84 | 61.5 | 4 | 0.8 | 171 | 126 | 1 | 0.7 |
| | 2 | 48 | 58 | 4 | 0.8 | 100 | 120 | 1 | 0.6 |
| | 3 | 100 | 58 | 2 | 0.8 | 100 | 120 | 1 | 0.7 |
| | 4 | 54 | 28 | 6 | 0.8 | 171 | 126 | 1 | 0.7 |
| | 5 | 48 | 58 | 4 | 0.8 | 100 | 120 | 1 | 0.5 |
| | 6 | 54 | 28 | 6 | 0.8 | 171 | 126 | 1 | 0.5 |
| | 7 | 54 | 28 | 6 | 0.8 | 100 | 58 | 2 | 0.7 |
| COMPAR-ATIVE EXAMPLE | 1 | 171 | 126 | 1 | 0.8 | 171 | 126 | 1 | 0.7 |
| | 2 | 100 | 58 | 1 | 0.8 | 100 | 120 | 1 | 0.5 |

TABLE 2

| Example | | AREA RATIO "a" (A1/A2) | THICKNESS RATIO "b" (t1/t2) | a × b | FLATNESS (mm) |
| --- | --- | --- | --- | --- | --- |
| INVENTION EXAMPLE | 1 | 0.24 | 1.14 | 0.274 | 0.3 |
| | 2 | 0.23 | 1.33 | 0.309 | 0.25 |
| | 3 | 0.48 | 1.14 | 0.552 | 0.4 |
| | 4 | 0.07 | 1.14 | 0.080 | 0.2 |
| | 5 | 0.23 | 1.60 | 0.371 | 0.3 |
| | 6 | 0.07 | 1.60 | 0.112 | 0.3 |
| | 7 | 0.26 | 1.14 | 0.298 | 0.25 |
| COMPAR-ATIVE EXAMPLE | 1 | 1.00 | 1.14 | 1.143 | 0.9 |
| | 2 | 0.48 | 1.60 | 0.773 | 0.85 |

As known from the results of Table 2, even though the copper boards having different thickness were bonded on the front and back surfaces of the large ceramic board, in Invention Examples 1 to 7, since the thick circuit layer-forming copper layer was composed of the divided first copper layers and the thin metal layer-forming copper layer was composed of the second copper layer(s) with the smaller arrangement number than the first copper layer, it was possible to reduce the warp in the bonded body of the ceramic body, the circuit layer-forming copper layer and the metal layer-forming copper layer in comparison with Comparative Examples 1 and 2 in which each of the circuit layer-forming copper layer and the metal layer-forming copper layer was single copper board respectively having the same plane size.

Furthermore, in Invention Examples 1 to 7, since the thickness t1 and the bonded area A1 of the first copper layers, the thickness t2 and the bonded area A2 of the second copper layer were adjusted into the relation of the product of multiplying the area ratio (A1/A2) and the thickness ratio (t1/t2) {(A1/A2)×(t1/t2)} to be not less than 0.080 and not more than 0.600, it was possible to make the bonded body in which the warps were as small as the flatness of the metal layer-forming copper layer not more than 0.5 mm.

INDUSTRIAL APPLICABILITY

It is possible to provide a method of manufacturing power module substrate boards at high productivity and provide ceramic-copper bonded bodies in which warps are reduced.

REFERENCE SIGNS LIST

10 Power module substrate board
11 Ceramic substrate board
12 Circuit layer
13 Metal layer
21 Ceramic board
30, 41, 42, 43 Bonded body (Ceramic-copper bonded body)
31, 33, 35 Circuit layer-forming copper layer
32, 36 Metal layer-forming copper layer
91 Element
101 Power module
121 Small circuit layer
211v, 211h Dividing groove
212 Substrate board-forming area
213 Margin area
301, 302 First copper board
303 Second copper board
311, 312, 313, 314, 315, 316 First copper layer
321, 322 Second copper layer

The invention claimed is:

1. A method of manufacturing a power module substrate board comprising the steps of: a bonded body-forming step forming a bonded body comprising a ceramic board having a dividing groove for dividing into two or more ceramic substrate boards, a circuit layer-forming copper layer bonded on a first surface of the ceramic board, and a metal layer-forming copper layer bonded on a second surface of the ceramic board; a pattern-forming step forming a circuit layer and a metal layer on respective substrate board-forming areas of the ceramic substrate boards partitioned by the dividing groove, by etching on the bonded body after the bonded body-forming step; and a dividing step forming a plurality of the power module substrate boards including the ceramic substrate board, the circuit layer, and the metal layer, by dividing the ceramic board along the dividing groove after the pattern-forming step, wherein in the bonded body-forming step, the circuit layer-forming copper layer consisting of two or more first copper boards is formed by arranging and bonding the two or more first copper boards on the first surface of the ceramic board; and the metal layer-forming copper layer consisting of one or more second copper boards composed with a smaller arrangement number than that of the first copper boards are formed by bonding a second copper board on the second surface of the ceramic board; the second copper board having a larger planar area than each planar area of the first copper boards and a smaller thickness than that of the first copper boards; and the second copper board is bonded so as to cover at least two of adjacent substrate board-forming areas among the substrate board-forming areas partitioned by the dividing groove; wherein the bonding of the first copper boards and the second copper boards to the ceramic board is performed by respectively arranging the first copper boards and the second copper boards on both surfaces of the ceramic board and then bonding the first copper boards and the second copper boards to the ceramic board by heating while adding a load in a lamination direction thereof wherein, in a combination of the single first copper layer and the single second copper layer which are opposed with the ceramic board therebetween, where a thickness of the first copper layer is t1, a bonded area of the first copper layer and the ceramic board is A1, a thickness of the second copper layer is t2, and a bonded area of the second copper layer and the ceramic board is A2; a product of multiplying an area ratio (A1/A2) of the bonded area A1 and the bonded area A2 and a thickness ratio (t1/t2) of the thickness t1 and the thickness t2, $\{(A1/A2) \times (t1/t2)\}$1 is not less than 0.080 and not more than 0.600; and wherein a warpage is as small as the flatness of the metal layer forming copper layer is not more than 0.5 mm after the bonded body-forming step.

2. The method of manufacturing power module substrate board according to claim 1, comprising a dividing groove-forming step forming the dividing groove on at least one of the first surface or the second surface of the ceramic board, on a surface of the ceramic board along outlines of the substrate board-forming areas.

3. The method of manufacturing power module substrate board according to claim 1, comprising a dividing groove-forming step forming the dividing groove on at least one of the first surface or the second surface of the ceramic board, on a surface of the ceramic board along outlines of the substrate board-forming areas.

\* \* \* \* \*